US010164046B2

(12) United States Patent
Chang et al.

(10) Patent No.: US 10,164,046 B2
(45) Date of Patent: Dec. 25, 2018

(54) METHOD FOR MANUFACTURING SEMICONDUCTOR STRUCTURE

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 15/652,176

(22) Filed: Jul. 17, 2017

(65) Prior Publication Data

US 2017/0317178 A1     Nov. 2, 2017

Related U.S. Application Data

(62) Division of application No. 15/051,619, filed on Feb. 23, 2016, now Pat. No. 9,716,154.

(Continued)

(51) Int. Cl.
*H01L 29/49*     (2006.01)
*H01L 29/417*    (2006.01)
(Continued)

(52) U.S. Cl.
CPC .... *H01L 29/4991* (2013.01); *H01L 21/31111* (2013.01); *H01L 29/0649* (2013.01);
(Continued)

(58) Field of Classification Search
CPC ............. H01L 29/4991; H01L 29/0649; H01L 29/0653; H01L 29/515; H01L 2221/1042; H01L 29/66545; H01L 29/66795; H01L 29/785; H01L 29/6653; H01L 29/6656; H01L 21/823431; H01L 27/0886; H01L 27/0924; H01L 21/30604; H01L 29/41791; H01L 29/401; H01L 21/845; H01L 21/823821; H01L 21/823468; H01L 21/0217; H01L 29/6681; H01L 21/764; H01L 21/7682; H01L 29/66636; H01L 21/28141; H01L 27/10826; H01L 27/10844; H01L 2924/13067; H01L 29/666

See application file for complete search history.

(56) References Cited

U.S. PATENT DOCUMENTS 5,869,374 A     2/1999     Wu
5,915,182 A     6/1999     Wu
(Continued)

*Primary Examiner* — Bac Au
(74) *Attorney, Agent, or Firm* — Cooper Legal Group, LLC

(57) ABSTRACT

A method for manufacturing a semiconductor structure includes forming a first dielectric layer on a gate structure and a source drain structure. A recess is formed at least partially in the first dielectric layer. A protection layer is formed at least on a sidewall of the recess. The recess is deepened to expose the source drain structure. A bottom conductor is formed in the recess and is electrically connected to the source drain structure. The protection layer is removed to form a gap between the bottom conductor and the sidewall of the recess.

20 Claims, 6 Drawing Sheets

Related U.S. Application Data

(60) Provisional application No. 62/269,032, filed on Dec. 17, 2015.

(51) Int. Cl.
*H01L 29/40* (2006.01)
*H01L 21/311* (2006.01)
*H01L 29/51* (2006.01)
*H01L 29/06* (2006.01)

(52) U.S. Cl.
CPC ........ *H01L 29/0653* (2013.01); *H01L 29/401* (2013.01); *H01L 29/41775* (2013.01); *H01L 29/41791* (2013.01); *H01L 29/515* (2013.01); *H01L 2221/1042* (2013.01)

(56) References Cited

U.S. PATENT DOCUMENTS

| | | | |
|---|---|---|---|
| 5,923,980 A | 7/1999 | Gardner et al. | |
| 6,064,107 A | 5/2000 | Yeh et al. | |
| 6,238,987 B1 | 5/2001 | Lee | |
| 6,683,355 B2 | 1/2004 | Gonzalez et al. | |
| 9,379,246 B2 | 6/2016 | Shimabukuro | |
| 9,536,982 B1 * | 1/2017 | Cheng | H01L 29/41791 |
| 9,786,737 B2 * | 10/2017 | Cheng | H01L 29/0649 |
| 2002/0163027 A1 | 11/2002 | Skotnicki et al. | |
| 2006/0084232 A1 | 4/2006 | Grupp et al. | |
| 2009/0029513 A1 | 1/2009 | Blanchard | |
| 2009/0087977 A1 | 4/2009 | Spuller et al. | |
| 2009/0108392 A1 | 4/2009 | Davies | |
| 2010/0163849 A1 | 7/2010 | Radosavlijevic et al. | |
| 2011/0156282 A1 | 6/2011 | Li et al. | |
| 2012/0199886 A1 * | 8/2012 | Horak | H01L 21/76897 257/288 |
| 2013/0043490 A1 | 2/2013 | Sorada | |
| 2013/0049132 A1 * | 2/2013 | Doris | H01L 21/7682 257/383 |
| 2013/0093019 A1 | 4/2013 | Ando et al. | |
| 2014/0054713 A1 * | 2/2014 | Lee | H01L 27/088 257/368 |
| 2014/0138779 A1 | 5/2014 | Xie et al. | |
| 2014/0179092 A1 * | 6/2014 | Kim | H01L 27/10888 438/586 |
| 2015/0014759 A1 * | 1/2015 | Lee | H01L 23/5329 257/306 |
| 2015/0243544 A1 * | 8/2015 | Alptekin | H01L 21/7682 438/586 |
| 2015/0372102 A1 | 12/2015 | Usami | |
| 2016/0181377 A1 | 6/2016 | Oh | |
| 2016/0225667 A1 * | 8/2016 | Zang | H01L 29/4991 |
| 2016/0365426 A1 * | 12/2016 | Ching | H01L 29/6656 |

* cited by examiner

METHOD FOR MANUFACTURING SEMICONDUCTOR STRUCTURE

RELATED APPLICATIONS

This application is a divisional of U.S. patent application Ser. No. 15/051,619, filed on Feb. 23, 2016, now U.S. Pat. No. 9,716,154, which claims priority to U.S. provisional application Ser. No. 62/269,032, filed on Dec. 17, 2015. All of these applications are incorporated herein by reference in their entireties.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

The word "interconnection" in integrated circuits means conductive lines which connect the various electronic components. The interconnecting conductive lines are separated from the substrate by insulating layers, except on the contact area. As feature densities increase, the widths of the conductive lines and the spacing between the conductive lines of interconnect structures also scale smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
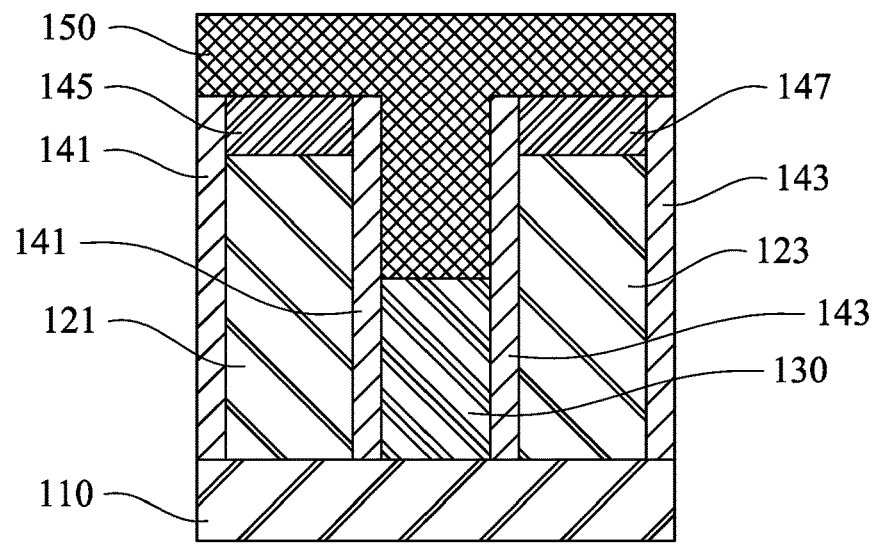
FIGS. 1-11 are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-11 are cross-sectional views of a method for manufacturing a semiconductor structure at various stages in accordance with some embodiments of the present disclosure.

Reference is made to FIG. 1. A semiconductor structure is formed. The semiconductor structure includes a substrate 110, gate structures 121 and 123, and at least one source drain structure 130. The gate structures 121 and 123 are respectively present on the substrate 110. The source drain structure 130 is present on the substrate 110 and adjacent to the gate structures 121 and 123. In other words, the source drain structure 130 is present between the gate structures 121 and 123. It is note that the numbers of the gate structures 121 and 123 and the number of the source drain structure 130 are illustrative and should not limit various embodiments of the present disclosure. A person having ordinary skill in the art may select suitable numbers for the gate structures 121 and 123 and the source drain structure 130 according to actual situations.

In some embodiments, the substrate 110 may be made of a semiconductor material and may include, for example, a graded layer or a buried oxide therein. In some embodiments, the substrate 110 includes bulk silicon that may be undoped or doped (e.g., p-type, n-type, or combinations thereof). Other materials that are suitable for semiconductor device formation may be used. For example, germanium, quartz, sapphire, and glass could alternatively be used for the substrate 110. Alternatively, the substrate 110 may be an active layer of a semiconductor-on-insulator (SOI) substrate or a multi-layered structure, such as a silicon-germanium layer formed on a bulk silicon layer.

In some embodiments, at least one stack of a gate dielectric layer, a diffusion barrier layer, a metal layer, a block layer, a wetting layer, and filling metal form at least one of the gate structures 121 and 123. In other words, at least one of the gate structures 121 and 123 may include the stack of the gate dielectric layer, the diffusion barrier layer, the metal layer, the block layer, the wetting layer, and the filling metal.

In some embodiments, the gate dielectric layer includes an interfacial layer (IL, the lower part of the gate dielectric layer), which is a dielectric layer. In some embodiments, the IL includes an oxide layer, such as a silicon oxide layer, which may be formed through a thermal oxidation of the substrate 110, a chemical oxidation, or a deposition step. The gate dielectric layer may also include a high-k dielectric layer (the upper part of the gate dielectric layer) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer), and a TaN layer (the upper part of the diffusion barrier layer) over the TiN layer.

When one of the gate structures 121 and 123 forms an n-type metal-oxide-semiconductor (MOS) device, the metal layer is in contact with the diffusion barrier layer. For example, in the embodiments in which the diffusion barrier layer includes a TiN layer and a TaN layer, the metal layer may be in physical contact with the TaN layer. In alternative embodiments in which one of the gate structures 121 and 123 forms a p-type MOS device, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed. The formation of the wetting layer improves the wetting of the filling metal to the underlying layers.

The source drain structure 130 may be formed by doping impurities into at least one active semiconductor fin, which is formed by, for example, patterning and etching the substrate 110 using photolithography techniques. In some embodiments that the resulting MOS device is an nMOS device, n-type impurities such as phosphorous or arsenic may be doped in the source drain structure 130. In some other embodiments that the resulting MOS device is a pMOS device, p-type impurities such as boron or $BF_2$ may be doped in the source drain structure 130.

Alternatively, the source drain structure 130 may be formed by, for example, epitaxial growth. In these embodiments, the source drain structure 130 may function as a source drain stressor to enhance carrier mobility of the semiconductor device and the device performance. The source drain structure 130 may be formed using a cyclic deposition and etching (CDE) process. The CDE process includes an epitaxial deposition/partial etch process and repeating the epitaxial deposition/partial etch process at least once.

In some embodiments that the resulting MOS device is an nMOS device, the source drain structure 130 may be an n-type epitaxy structure. In some embodiments that the resulting MOS device is a pMOS device, the source drain structure 130 may be a p-type epitaxy structure. The n-type epitaxy structure may be made of SiP, SiC, SiPC, Si, III-V compound semiconductor materials or combinations thereof, and the p-type epitaxy structure may be made of SiGe, SiGeC, Ge, Si, III-V compound semiconductor materials, or combinations thereof. During the formation of the n-type epitaxy structure, n-type impurities such as phosphorous or arsenic may be doped with the proceeding of the epitaxy. For example, when the n-type epitaxy structure include SiP or SiC, n-type impurities are doped. Moreover, during the formation of the p-type epitaxy structure, p-type impurities such as boron or $BF_2$ may be doped with the proceeding of the epitaxy. For example, when the p-type epitaxy structure includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The source drain structure 130 may be in-situ doped. If the source drain structure 130 is not in-situ doped, a second implantation process (i.e., a junction implant process) is performed to dope the source drain structure 130. One or more annealing processes may be performed to activate the source drain structure 130. The annealing processes include rapid thermal annealing (RTA) and/or laser annealing processes.

In addition, spacers 141 are present on sidewalls of the gate structure 121, and spacers 143 are present on sidewalls of the gate structure 123. In some embodiments, at least one of the spacers 141 and 143 include one or more layers, including silicon nitride, silicon oxynitride, silicon oxide, or other dielectric materials. The available formation methods include plasma enhanced chemical vapor deposition (PECVD), low-pressure chemical vapor deposition (LP- CVD), sub-atmospheric chemical vapor deposition (SACVD), and other deposition methods.

Moreover, a hard mask layer 145 is present on a top surface of the gate structure 121, and a hard mask layer 147 is present on a top surface of the gate structure 123. The hard mask layers 145 and 147 may include, for example, silicon nitride or the like. The hard mask layers 145 and 147 may be formed using chemical vapor deposition (CVD), physical vapor deposition (PVD), atomic layer deposition (ALD), other suitable processes, or combinations thereof.

Then, a dielectric layer 150 is formed on the gate structures 121 and 123 and the source drain structure 130. The dielectric layer 150 is an interlayer dielectric (ILD) layer. The dielectric layer 150 is made of a dielectric material, such as silicon oxide, silicon nitride, silicon oxynitride, or combinations thereof. In some embodiments, the dielectric layer 150 is made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. In some embodiments, the low-κ dielectric material is, for example, nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 150 is formed by, for example, chemical vapor deposition (CVD), spin coating, or combinations thereof.

Figure 2:
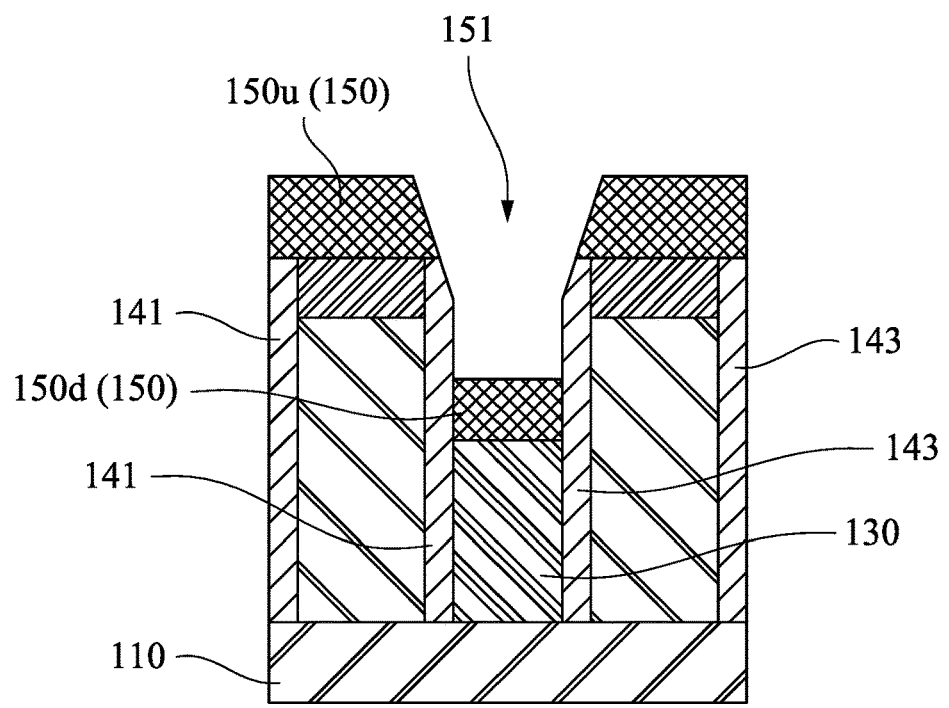

Reference is made to FIG. 2. A recess 151 is formed at least partially in the dielectric layer 150 to expose at least a portion of at least one of the spacers 141 and 143, while a portion of the dielectric layer 150 (the dielectric layer 150d) is left on the source drain structure 130, in which the dielectric layer 150d is present adjacent to the spacers 141 and 143 and between the spacers 141 and 143. The recess 151 is formed by a photolithography and etching process. The photolithography and etching process includes photoresist application, exposure, developing, etching, and photoresist removal. A photoresist is applied onto the dielectric layer 150 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist.

At least one portion of the dielectric layer 150 which is not protected by the remaining photoresist is etched to form the recess 151. The etching of the dielectric layer 150 may be dry etching, such as reactive ion etching (RIE), plasma enhanced (PE) etching, or inductively coupled plasma (ICP) etching. In some embodiments, when the dielectric layer 150 is made of silicon oxide, fluorine-based RIE can be used to form the recess 151. The gas etchant used to dry etch the dielectric layer 150 is, for example, $CF_4/O_2$.

After the recess 151 is formed, the photoresist is removed from the dielectric layer 150 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the dielectric layer 150.

Figure 3:
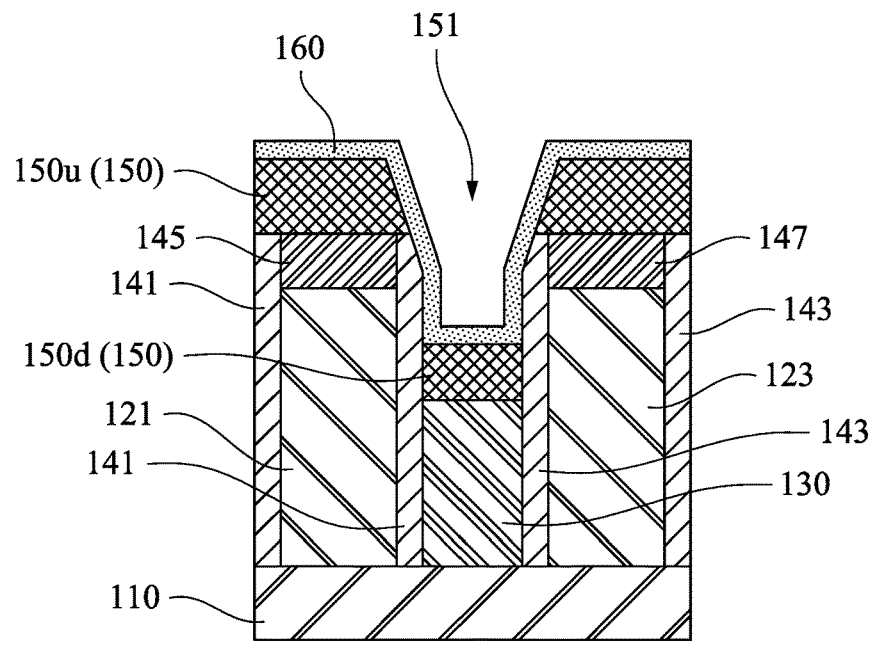

Reference is made to FIG. 3. A protection layer 160 is formed on a top surface of portions of the dielectric layer 150 (the dielectric layer 150u) on or above the gate structures 121 and 123 (or, on or above the hard mask layers 145 and 147), at least one sidewall of the recess 151 (i.e., at least one sidewall of the dielectric layer 150u and at least a portion of the exposed spacers 141 and 143), and a bottom surface of the recess 151 (i.e., a top surface of the dielectric layer 150d). The protection layer 160 may include, for example, silicon nitride, silicon oxynitride, or the like. The protection layer 160 may be formed using atomic layer deposition (ALD), other suitable processes, or combinations thereof.

Figure 4:
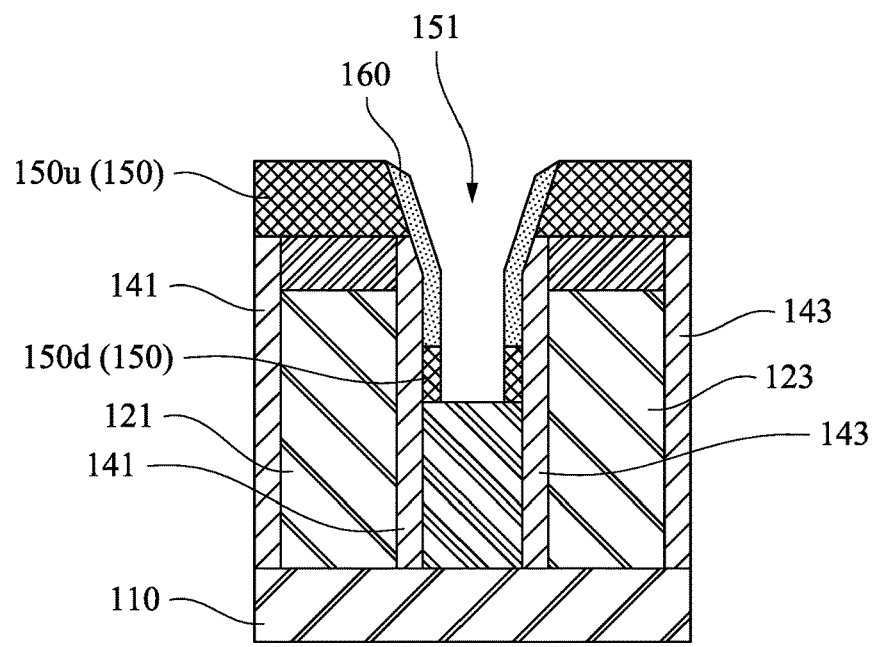

As shown in FIG. 3 and FIG. 4, an anisotropic etching is performed to remove at least portions of the protection layer 160 on top surfaces of the dielectric layer 150u and on the bottom surface of the recess 151 (i.e., on the top surface of the dielectric layer 150d) and a portion of the dielectric layer 150d while the residual protection layer 160 and a portion of the residual dielectric layer 150d still cover the sidewalls of the recess 151 (i.e., the sidewalls of the dielectric layer 150u and the spacers 141 and 143). Therefore, the recess 151 is deepened, and the source drain structure 130 is exposed by the deepened recess 151. In some embodiments, the anisotropic etching may be dry etching, such as reactive ion etching (RIE), plasma enhanced (PE) etching, or inductively coupled plasma (ICP) etching.

Figure 5:
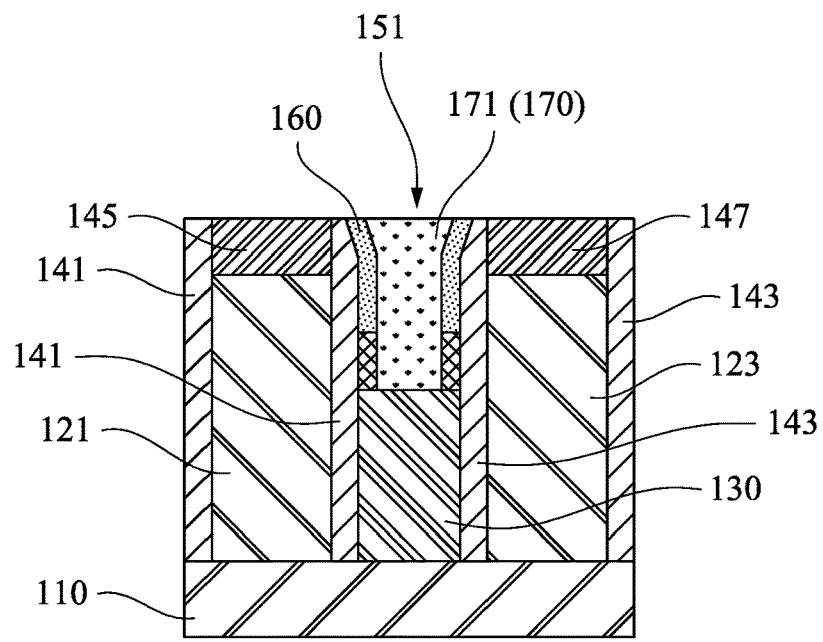

Reference is made to FIG. 4 and FIG. 5. A conductive layer 170 overfills the recess 151, such that a bottom conductor 171 is formed in the recess 151 and the bottom conductor 171 is electrically connected to the source drain structure 130. The conductive layer 170 is made of metal, such as copper (Cu), aluminum (Al), tungsten (W), nickel (Ni), cobalt (Co), titanium (Ti), platinum (Pt), tantalum (Ta), or combinations thereof. The conductive layer 170 is formed by, for example, electrochemical deposition, physical vapor deposition (PVD), chemical vapor deposition (CVD), or combinations thereof.

Then, the dielectric layers 150u, the upper portion of the protection layer 160 (the height of the upper portion of the protection layer 160 is greater than the height of the gate structures 121 and 123 and the height of the hard mask layers 145 and 147), and the upper portion of the conductive layer 170 (the height of the upper portion of the conductive layer 170 is greater than the height of the gate structures 121 and 123 and the height of the hard mask layers 145 and 147), which includes the upper portion of the bottom conductor 171, are removed through a removal process. In some embodiments, the dielectric layer 150u, the protection layer 160, and the conductive layer 170 over burden are removed by a chemical mechanical polishing (CMP) process. In some embodiments, when the conductive layer 170 is made of copper (Cu), the CMP slurry is made of, for example, a mixture of suspended abrasive particles, an oxidizer, and a corrosion inhibitor, and the CMP slurry is acidic. A two-step CMP process may be used to remove the excess dielectric layers 150u, the protection layer 160, and the conductive layer 170. In the first step, the abrasive will remove the conductive layer 170 without disturbing the dielectric layers 150u and the protection layer 160. In the second step, the residual dielectric layers 150u, the protection layer 160, and the conductive layer 170 will be removed using silica abrasive. After the CMP process, the protection layer 160 is present between the bottom conductor 171 and the spacer 141 and between the bottom conductor 171 and the spacer 143.

Figure 6:
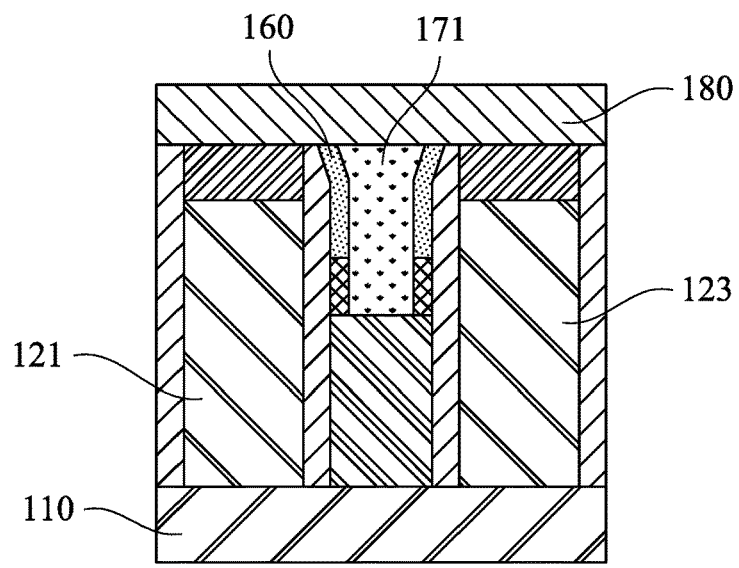

Reference is made to FIG. 6. A dielectric layer 180 is formed on the gate structures 121 and 123, the protection layer 160, and the bottom conductor 171. The dielectric layer 180 is an interlayer dielectric (ILD) layer. The dielectric layer 180 is made of a dielectric material, such as silicon oxide, silicon nitride, silicon oxynitride, or combinations thereof. In some embodiments, the dielectric layer 180 is made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. In some embodiments, the low-κ dielectric material is, for example, nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), polyarylene ethers (PAE), diamond-like carbon (DLC) doped with nitrogen, or combinations thereof. The dielectric layer 180 is formed by, for example, chemical vapor deposition (CVD), spin coating, or combinations thereof.

Figure 7:
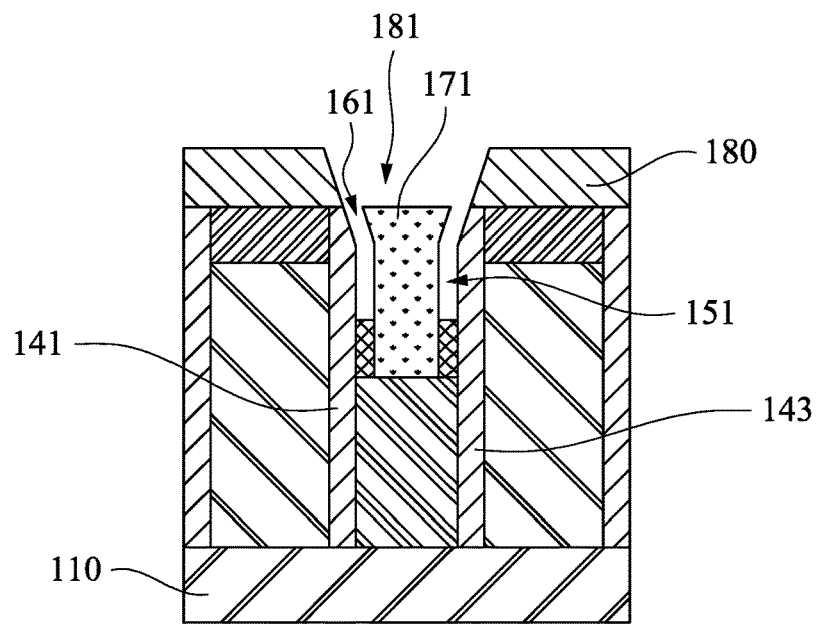

As shown in FIG. 6 and FIG. 7, an opening 181 is formed in the dielectric layer 180 to at least partially expose the protection layer 160 and at least a portion of the bottom conductor 171. The opening 181 is formed by a photolithography and etching process. In some embodiments, a layer of photoresist material (not shown) is formed over the dielectric layer 180. The layer of photoresist material is irradiated (or exposed) in accordance with a pattern (the opening 181) and developed to remove a portion of the photoresist material. The remaining photoresist material protects the underlying material from subsequent processing steps, such as etching. Then, an etching process is performed to form the opening 181.

Then, the protection layer 160 is removed, such that a gap 161 is formed between the bottom conductor 171 and the spacer 141 and between the bottom conductor 171 and the spacer 143. In other words, the gap 161 is formed between the bottom conductor 171 and the sidewall of the recess 151. In some embodiments, a selective wet etching process, which is a chemical etching process, may be performed to remove the protection layer 160. A wet etching solution includes a hot phosphoric acid solution. The wet etching processes have etching parameters that can be tuned, such as etchants used, etching temperature, etching solution concentration, etching pressure, etchant flow rate, and other suitable parameters.

Figure 8:
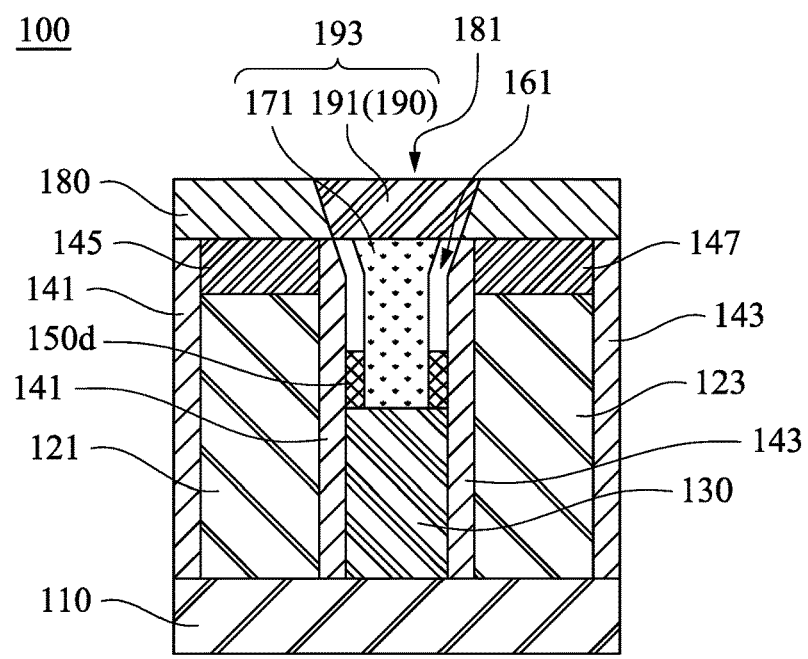

In FIG. 8, a conductive layer 190 overfills the opening 181, and then the excess conductive layer 190 outside of the opening 181 is removed. The conductive layer 190 is made of metal, such as copper (Cu), aluminum (Al), tungsten (W), nickel (Ni), cobalt (Co), titanium (Ti), platinum (Pt), tantalum (Ta), or combinations thereof. The conductive layer 190 is formed by, for example, electrochemical deposition, physical vapor deposition (PVD), chemical vapor deposition (CVD), or combinations thereof.

The excess conductive layer 190 outside of the opening 181 is removed through a removal process. In some embodiments, the conductive layer 190 over burden is removed by a chemical mechanical polishing (CMP) process. In some embodiments, when the conductive layer 190 is made of copper (Cu), the CMP slurry is made of, for example, a mixture of suspended abrasive particles, an oxidizer, and a corrosion inhibitor, and the CMP slurry is acidic. After the CMP process, a upper conductor 191 (the conductive layer 190) is formed in the opening 181 of the dielectric layer 180. The upper conductor 191 is electrically connected to the bottom conductor 171, and the upper conductor 191 is in direct contact with at least one sidewall of the opening 181.

In another aspect of the present disclosure, as shown in FIG. 8, a semiconductor structure 100 is provided. The semiconductor structure 100 includes a substrate 110, gate structures 121 and 123, spacers 141 and 143, at least one source drain structure 130, and at least one conductor 193. The gate structures 121 and 123 are present on the substrate 110. The spacer 141 is present on at least one sidewall of the gate structure 121, and the spacer 143 is present on at least one sidewall of the gate structure 123. The source drain structure 130 is present on the substrate 110 and adjacent to the spacers 141 and 143, and the source drain structure 130 is present between the source drain structures 121 and 123. The conductor 193 includes an upper conductor 191 and a bottom conductor 171. The bottom conductor 171 is electrically connected to the source drain structure 130. The upper conductor 191 is electrically connected to the bottom conductor 171. The bottom conductor 171 has an upper portion and a lower portion between the upper portion and the source drain structure 130, and a gap 161 is at least present between the upper portion of the bottom conductor 171 and the gate structure 121 and between the upper portion of the bottom conductor 171 and the gate structure 123. The upper conductor 191 covers the gap 161.

The semiconductor structure 100 further includes a dielectric layer 180. The dielectric layer 180 is present at least on one of the gate structures 121 and 123 and has an opening 181 therein. The source drain structure 130 is exposed through the opening 181, and at least a portion of the upper conductor 191 is present in the opening 181. The upper conductor 191 is in direct contact with at least one sidewall of the opening 181. Additionally, at least portions of the spacers 141 and 143 are exposed through the opening 181, and the gap 161 exists between the bottom conductor 171 and the portions of the spacers 141 and 143 exposed by the opening 181.

The semiconductor structure 100 further includes a dielectric layer 150d. The dielectric layer 150d is present between the lower portion of the bottom conductor 171 and the spacer 141 (or the gate structure 121) and between the lower portion of the bottom conductor 171 and the spacer 143 (or the gate structure 123). The gap 161 exists above the dielectric layer 150d. That is, the dielectric layer 150d is present between the gap 161 and the source drain structure 130.

Specifically, the height of the dielectric layer 150d is in a range from about 5 nm to 1000 nm (i.e., the distance between the top surface and the bottom surface of the dielectric layer 150d), and the width of the dielectric layer 150d is in a range from about 5 Å to about 100 Å (i.e., the distance between the two side surfaces of dielectric layer 150d). Embodiments of this disclosure are not limited thereto. The person having ordinary skill in the art can make proper modifications to the dielectric layer 150d depending on the actual application.

The semiconductor structure 100 further includes a hard mask layer 145 present on a top surface of the gate structure 121 and a hard mask layer 147 present on a top surface of the gate structure 123. In other words, the hard mask layer 145 is present between the gate structure 121 and the dielectric layer 180, and the hard mask layer 147 is present between the gate structure 123 and the dielectric layer 180.

The gap 161 may have gas therein. In other words, the gap 161 may be gas-filled. Embodiments of this disclosure are not limited thereto. The person having ordinary skill in the art can make proper modifications to the gap 161 depending on the actual application.

The source drain structure 130 may include at least one source drain stressor. Embodiments of this disclosure are not limited thereto. The person having ordinary skill in the art can make proper modifications to the source drain structure 130 depending on the actual application.

Since the upper conductor 191 and the bottom conductor 171 are formed in different operations, the upper conductor 191 can be in direct contact with at least one sidewall of the opening 181. In other words, the upper conductor 191 is in direct contact with the dielectric layer 180. Therefore, there is no other component present between the upper conductor 191 and the dielectric layer 180, so the width of the conductor 193 can be greater.

Figure 9:
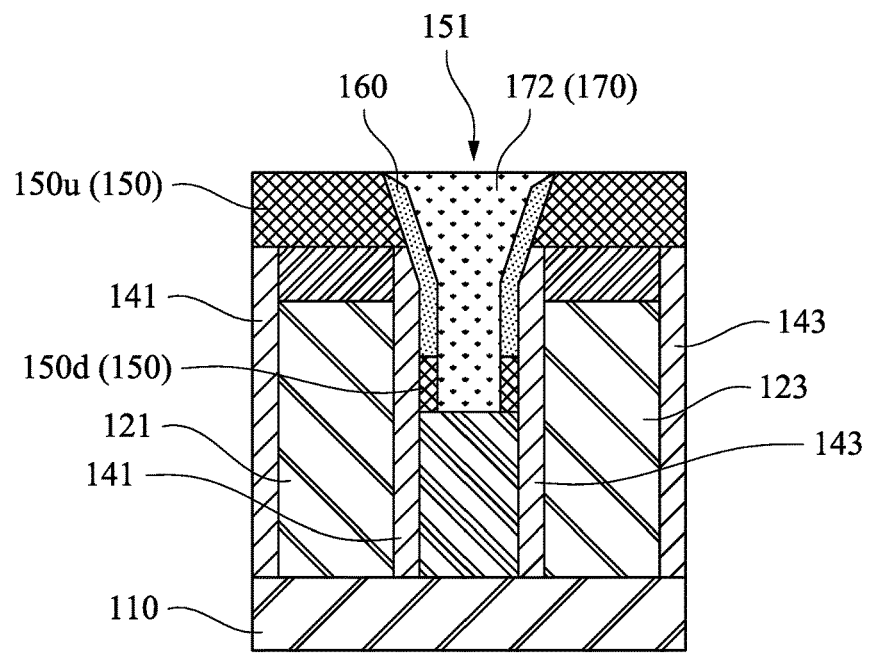

Reference is made to FIG. 9. In some embodiments, after the anisotropic etching shown in FIG. 4, the conductive layer 170 overfills the recess 151. Then, the upper portion of the conductive layer 170 above the dielectric layer 150u is removed through a removal process. In some embodiments, the conductive layer 170 over burden is removed by a chemical mechanical polishing (CMP) process. In some embodiments, when the conductive layer 170 is made of copper (Cu), the CMP slurry is made of, for example, a mixture of suspended abrasive particles, an oxidizer, and a corrosion inhibitor, and the CMP slurry is acidic. After the CMP process, a bottom conductor 172 (the conductive layer 170) is formed in the recess 151.

Figure 10:
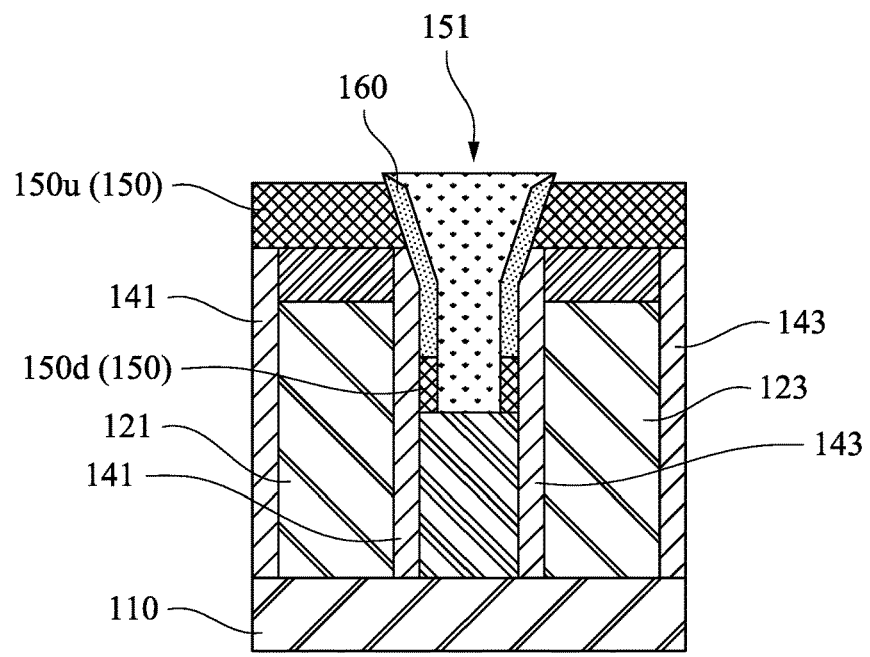

Reference is made to FIG. 10. A portion of the dielectric layer 150u is etched back to at least partially expose the protection layer 160. The etching of the dielectric layer 150u may be dry etching, such as reactive ion etching (RIE), plasma enhanced (PE) etching, or inductively coupled plasma (ICP) etching. In some embodiments, when the dielectric layer 150u is made of silicon oxide, fluorine-based RIE can be used to etch back the dielectric layer 150u. The gas etchant used to dry etch the dielectric layer 150u is, for example, $CF_4/O_2$.

Figure 11:
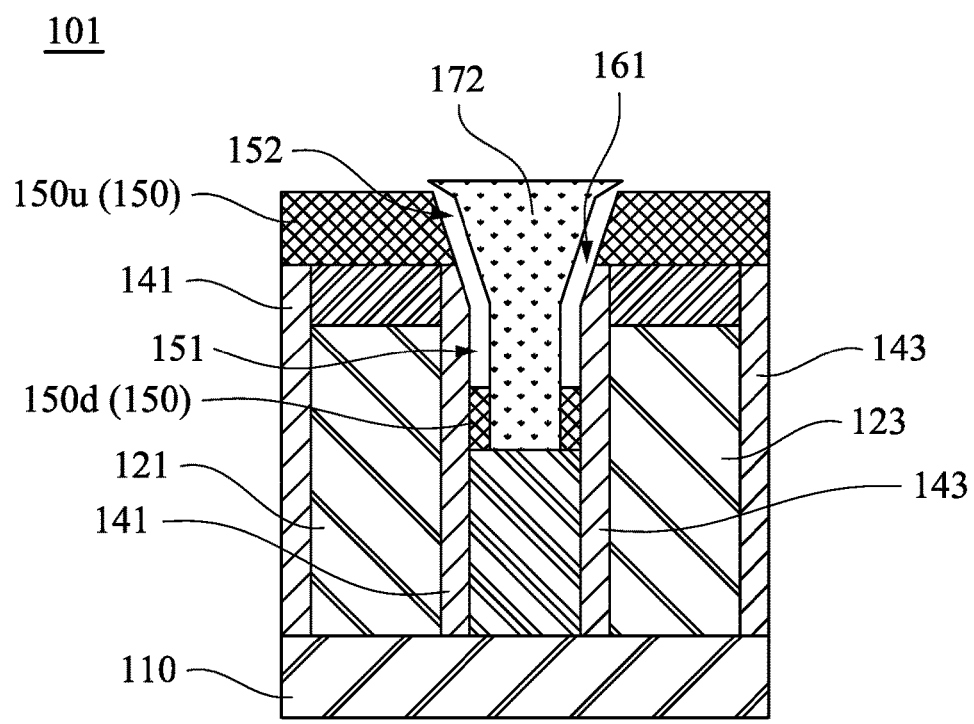

Reference is made to FIG. 10 and FIG. 11. The protection layer 160 is removed, such that a gap 161 is present between the bottom conductor 172 and the spacer 141 and between the bottom conductor 172 and the spacer 143. The dielectric layer 150u has an opening 152 therein, which is a part of the recess 151, and at least a part of the upper portion of the bottom conductor 172 is present in the opening 152. In some embodiments, a selective wet etching process, which is a chemical etching process, may be performed to remove the protection layer 160. A wet etching solution includes a hot phosphoric acid solution. The wet etching processes have etching parameters that can be tuned, such as etchants used, etching temperature, etching solution concentration, etching pressure, etchant flow rate, and other suitable parameters.

In another aspect of the present disclosure, as shown in FIG. 11, a semiconductor structure 101 is provided. The semiconductor structure 101 is similar to the semiconductor structure 100 of FIG. 8, and the difference between the semiconductor structure 100 of FIG. 11 and the semiconductor structure 100 of FIG. 8 is that the gap 161 of FIG. 11 is further present between the upper portion of the bottom conductor 172 and at least one sidewall of the opening 152.

The protection layer 160 can protect the spacers 141 and 143 from being over-etched during the deepening the recess 151. With the protection layer 160, the device size can be further reduced without putting a heavy load on the photolithography and etching process, and thus the device performance can be improved. Furthermore, the overlay and pattern loading requirements can be loosened. In addition, the protection layer 160 can enlarge the process window for contact hole formation and improve in-line control in the semiconductor device fabrication process. Therefore, the reliability and/or the yield in fabricating the semiconductor devices can be improved. After formation of the bottom conductor 171/172, the protection layer 160 can be removed to reduce parasitic capacitance and thus further enhance the device performance.

According to some embodiments of the present disclosure, a method for manufacturing a semiconductor structure includes forming a first dielectric layer on a gate structure and a source drain structure. A recess is formed at least partially in the first dielectric layer. A protection layer is formed at least on a sidewall of the recess. The recess is deepened to expose the source drain structure. A bottom conductor is formed in the recess and is electrically connected to the source drain structure. The protection layer is removed to form a gap between the bottom conductor and the sidewall of the recess.

According to some embodiments of the present disclosure, a method for manufacturing a semiconductor structure includes forming a first opening in a first dielectric layer to expose a source drain structure. A bottom conductor is formed in the first opening such that the bottom conductor is electrically connected to the source drain structure. A gap is formed around the bottom conductor. An upper conductor is formed on the bottom conductor and is formed to cap a top opening of the gap.

According to some embodiments of the present disclosure, a method for manufacturing a semiconductor structure includes forming a first dielectric layer on a gate structure and a source drain structure. A recess is formed at least partially in the first dielectric layer. A protection layer is formed at least on a sidewall of the recess. The recess is deepened to expose the source drain structure. A conductive material is overfilled in the recess. The conductive material, the protection layer, and the first dielectric layer above the gate structure are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
   forming a first dielectric layer on a gate structure and a source drain structure;
   forming a recess at least partially in the first dielectric layer;
   forming a protection layer at least on a sidewall of the recess;
   deepening the recess to expose the source drain structure;
   forming a bottom conductor in the recess, wherein:
      the bottom conductor is electrically connected to the source drain structure, and
      forming the bottom conductor comprises:
         overfilling a conductive material in the recess; and
         removing the conductive material and the first dielectric layer above the gate structure; and
   forming a second dielectric layer on the gate structure;
   forming an opening in the second dielectric layer to expose the bottom conductor and the protection layer; and
   removing the protection layer through the opening to form a gap between the bottom conductor and the sidewall of the recess.

2. The method of claim 1, wherein the recess is deepened such that a portion of the first dielectric layer is left on the sidewall of the recess.

3. The method of claim 2, wherein the portion of the first dielectric layer left on the sidewall of the recess is between the gap and the source drain structure after the protection layer is removed.

4. The method of claim 1, further comprising:
   forming an upper conductor in the opening, wherein the upper conductor is electrically connected to the bottom conductor.

5. The method of claim 1, wherein:
   the protection layer is further formed on a bottom surface of the recess, and deepening the recess comprises:
      removing a portion of the protection layer on the bottom surface of the recess.

6. The method of claim 1, further comprising:
   forming an upper conductor in the opening, wherein the upper conductor is formed to cap a top opening of the gap.

7. The method of claim 1, wherein:
   a hard mask is over the gate structure, and the method further comprises:
      after deepening the recess, removing a portion of the first dielectric layer over the hard mask to expose the hard mask.

8. The method of claim 1, further comprising:
   forming the source drain structure above a substrate.

9. The method of claim 8, wherein forming the source drain structure comprises forming the source drain structure to contact a sidewall of a spacer adjacent to the gate structure.

10. The method of claim 1, wherein forming the recess comprises etching a spacer adjacent to the gate structure to form a tapered sidewall.

11. The method of claim 10, wherein forming the protection layer comprises forming the protection layer to contact the tapered sidewall of the spacer.

12. A method for manufacturing a semiconductor structure, the method comprising:
   forming a first opening in a first dielectric layer to expose a source drain structure;
   forming a protection layer on a sidewall of the first opening;
   forming a bottom conductor in the first opening such that the bottom conductor is electrically connected to the source drain structure;
   forming a second dielectric layer on the bottom conductor and the protection layer;
   forming a second opening in the second dielectric layer to expose a top surface of the bottom conductor and a top surface the protection layer;
   forming a gap around the bottom conductor by removing the protection layer through the second opening; and
   forming an upper conductor on the bottom conductor, wherein the upper conductor is formed to cap a top opening of the gap.

13. The method of claim 12, wherein forming the upper conductor comprising:
   overfilling a conductive material in the second opening; and
   removing a portion of the conductive material exceeding the second opening.

14. The method of claim 12, wherein the protection layer comprises a nitride material.

15. The method of claim 12, wherein the first dielectric layer comprises a low-K dielectric material.

16. A method for manufacturing a semiconductor structure, the method comprising:
   forming a first opening in a first dielectric layer to expose a source drain structure;
   forming a protection layer on a sidewall of the first opening, wherein the first dielectric layer has a portion surrounding the protection layer;
   forming a bottom conductor in the first opening such that the bottom conductor is electrically connected to the source drain structure;
   etching back the portion of the first dielectric layer surrounding the protection layer to expose at least a portion of a sidewall of the protection layer;
   forming a gap around the bottom conductor by removing the protection layer; and
   forming an upper conductor on the bottom conductor, wherein the upper conductor is formed to cap a top opening of the gap.

17. The method of claim 16, wherein the protection layer comprises a nitride material.

18. The method of claim 16, wherein the first dielectric layer comprises a low-K dielectric material.

19. The method of claim 16, wherein forming the gap comprises forming the gap to expose the first dielectric layer.

20. The method of claim 16, wherein etching back the portion of the first dielectric layer comprises etching back the portion of the first dielectric layer such that a top surface of the bottom conductor is above a top surface of the first dielectric layer.

* * * * *